United States Patent [19]
Ballato et al.

[11] Patent Number: 4,950,937
[45] Date of Patent: Aug. 21, 1990

[54] METHOD OF MAKING A RESONATOR FROM A BOULE OF LITHIUM TETRABORATE AND RESONATOR SO MADE

[75] Inventors: Arthur Ballato, Long Branch; John A. Kosinski, Wall Township, Monmouth County, both of N.J.

[73] Assignee: The United States of America as represented by the Secretary of the Army, Washington, D.C.

[21] Appl. No.: 406,933

[22] Filed: Sep. 13, 1989

[51] Int. Cl.$^5$ .............................................. H01L 41/08
[52] U.S. Cl. ..................................................... 310/360
[58] Field of Search ............................ 310/360, 313 A

[56] References Cited

U.S. PATENT DOCUMENTS

| | | | |
|---|---|---|---|
| 4,523,119 | 6/1985 | Whatmore et al. | 310/313 A |
| 4,634,913 | 1/1987 | Whatmore et al. | 310/360 X |
| 4,672,255 | 6/1987 | Suzuki et al. | 310/313 A |
| 4,772,817 | 9/1988 | Aida et al. | 310/360 X |

*Primary Examiner*—Mark O. Budd
*Attorney, Agent, or Firm*—Michael Zelenka; Roy E. Gordon

[57] ABSTRACT

An improved resonator is obtained by providing a plate of lithium tetraborate with a doubly rotated orientation of $\phi \approx 38°$ to $42°$ and $\theta \approx 30°$ to $36°$ where doubly rotated orientations are described by the IEEE notation widely known in the art as $(YXwl)\phi/\theta$.

2 Claims, No Drawings

METHOD OF MAKING A RESONATOR FROM A BOULE OF LITHIUM TETRABORATE AND RESONATOR SO MADE

The invention described herein may be manufactured, used, and licensed by or for the Government for governmental purposes without the payment to us of any royalty thereon.

This invention relates in general to a method of making a temperature compensated resonator and to the resonator so made, and in particular to a method of making a temperature compensated resonator from a boule of lithium tetraborate and to the resonator so made.

BACKGROUND OF THE INVENTION

Lithium tetraborate, $Li_2B_4O_7$, is an insulating dielectric material that is piezoelectric but is not ferroelectric. This means that it is capable of being mechanically stimulated into vibration (piezoelectric effect) but it is not necessary to subject the material to poling such as would be required for a ferroelectric material such as lithium niobate ($LiNbO_3$) Furthermore, $Li_2B_4O_7$ is not enantiomorphous. This means that it does not have the disadvantage of twinning as quartz does. $Li_2B_4O_7$ has moderate piezoelectric coupling and orientations at which the first order temperature coefficient of frequency is zero.

Notwithstanding the presence of zero first-order temperature coefficient cuts, the resulting frequency versus temperature characteristics of resonators made from plates of $Li_2B_4O_7$ cut at these orientations, is poor. This is because the second-order temperature coefficient of frequency is, in general, large at these orientations rendering them unsuitable as commercial resonators or transducers.

Most of the resonators or transducers in use today that have low temperature coefficients of frequency operate by virtue of the mechanical shear mode. The use of the thickness extensional mode of a plate has the advantage of a higher sound velocity than the shear waves thus giving a higher operating frequency for a given thickness. Moreover, in transducer applications, particularly, the extensional mode is preferred because it is more readily transmitted into other media.

SUMMARY OF THE INVENTION

The general object of this invention is to provide a resonator characterized by frequency insensitivity to temperature variations. A more particular object of the invention is to provide a resonator in which both the first- and the second-order temperature coefficient of frequency are substantially zero. Another object of the invention is to provide a resonator in which the piezoelectric coupling is large. Still another object of the invention is to provide a resonator in which the piezoelectric coupling is large for the extensional mode of vibration.

It has now been found that the aforementioned objects can be attained by providing a resonator in which $Li_2B_4O_7$ is oriented with respect to its crystallographic axes to form a plate having a doubly rotated orientation of $\phi \approx 38°$ to $42°$ and $\theta \approx 30°$ to $36°$ where doubly rotate the IEEE notation widely known in the art as $(YXw1)\phi/\theta$ and in which the plate is lapped and polished and metallic electrodes then deposited on the major surfaces of the plate, the plate then mounted in an evacuated sealed enclosure to form a resonator and the resonator subjected to an alternating voltage across the electrodes at a frequency that piezoelectrically excites the fundamental harmonic of the thickness extensional mode.

In lieu of a resonator, the method of the invention is applicable to transducers, oscillators, filters, signal processors for radar and communications and the like. Whereas, previously, $Li_2B_4O_7$ exhibited good temperature behavior with poor piezo effect or good piezo effect with poor temperature behavior, the present invention provides $Li_2B_4O_7$ with both good temperature behavior with large piezo effect.

PREFERRED EMBODIMENT

A transducer is desired for the purposes of medical ultrasound instrumentation. To obtain such a transducer a $Li_2B_4O_7$ plate resonator having a doubly rotated orientation of $\phi \approx 40°$ and $\theta \approx 33°$ is used. The resonator is circular in outline with a diameter of 15 millimeters and thickness of about 0.5 millimeter. The transducer is driven at the fundamental harmonic of the thickness extensional mode which occurs at approximately 7.4 megahertz. This resonance has an effective piezoelectric coupling factor of approximately 20 percent, and the first- and the second-order temperature coefficients of frequency are negligible.

As can be seen from the above embodiment, the heart of the invention lies in the discovery of the values for the two angles $\phi$ and $\theta$ specifying the doubly rotated orientation at which the fundamental harmonic of the thickness extensional mode has simultaneously, vanishingly small values of the first- and second-order temperature coefficients of frequency.

Doubly rotated orientations are described by the IEEE notation widely known in the art as $(YXw1)\phi/\theta$.

We wish it to be understood that we do not desire to be limited to the exact details of construction shown and described for obvious modifications will occur to a person skilled in the art.

What is claimed is:

1. In a resonator including a lapped and polished plate of lithium tetraborate with metallic electrodes deposited on the major surfaces of the plate and the plate mounted in an evacuated sealed enclosure, the improvement of providing the plate with a doubly rotated orientation of $\phi \approx 38+$ to $42°$ and $\theta \approx 30°$ to $36°$ where doubly rotated orientations are described by the IEEE notation widely known in the art as $(YXw1)\phi/\theta$.

2. In a resonator according to claim 1 the improvement of providing the plate with a doubly rotated orientation of $\phi \approx 40°$ and $\theta \approx 33°$.

* * * * *